United States Patent
Shieh

(10) Patent No.: US 12,368,455 B2
(45) Date of Patent: Jul. 22, 2025

(54) FLEXIBLE AND CONFIGURABLE BIT ERROR RATE REDUCTION FOR NON-VOLATILE MEMORY

(71) Applicant: Crossbar, Inc., Santa Clara, CA (US)

(72) Inventor: Ming-Huei Shieh, Cupertino, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 18/142,936

(22) Filed: May 3, 2023

(65) Prior Publication Data

US 2024/0372564 A1 Nov. 7, 2024

(51) Int. Cl.
*H03M 13/00* (2006.01)
*H03M 13/13* (2006.01)

(52) U.S. Cl.
CPC ......... *H03M 13/13* (2013.01); *H03M 13/611* (2013.01)

(58) Field of Classification Search
CPC .... H03M 13/13; H03M 13/19; H03M 13/611; G06F 11/102; G06F 3/0653; G06F 11/1044
See application file for complete search history.

(56) References Cited

U.S. PATENT DOCUMENTS

| | | | |
|---|---|---|---|
| 9,003,103 B2* | 4/2015 | Paleologu | G06F 11/1076 711/170 |
| 9,081,062 B1* | 7/2015 | Pedersen | G11C 29/52 |
| 9,396,132 B2* | 7/2016 | Adachi | G11C 11/1675 |
| 9,983,830 B2* | 5/2018 | Ware | G11C 7/1006 |
| 10,157,093 B2* | 12/2018 | Cunningham | G11C 7/00 |
| 10,445,190 B2* | 10/2019 | Li | G06F 11/1012 |
| 10,635,531 B2* | 4/2020 | Cha | G11C 29/72 |
| 10,684,961 B1* | 6/2020 | Seshadri | G06F 12/0864 |
| 11,036,581 B2* | 6/2021 | Chen | G06F 11/1048 |
| 11,175,915 B2* | 11/2021 | Finkbeiner | G06F 9/3012 |
| 11,398,977 B2* | 7/2022 | Williams | H04L 43/028 |
| 2018/0167088 A1* | 6/2018 | Vakilinia | G06F 11/108 |
| 2019/0026181 A1 | 1/2019 | Kim et al. | |

OTHER PUBLICATIONS

Partial European Search report for EP Application No. 24174138.8 dated Nov. 20, 2024, 16 pages long.
Extended European Search report for EP Application No. 24174138. 8-1203 dated Feb. 12, 2025, 14 pages long.

* cited by examiner

*Primary Examiner* — Esaw T Abraham
(74) *Attorney, Agent, or Firm* — Wegman Hessler Valore

(57) ABSTRACT

Improved bit error correction for non-volatile memory can be implemented in multiple stages achieving improved correction capacity. As an example, bit error correction for a set of data can utilize a logic or a differential algorithm applied to one or more copies (N) of the set of data to produce a logic (or differential) output. An error correction code (ECC) can be applied to the logic (or differential) output to produce corrected data that corrects bit errors of the set of data, if any, up to a maximum for the ECC selected. An algorithm can be selected to address measured bit error rates or variations in bit error rates among binary bit states of a non-volatile memory.

11 Claims, 13 Drawing Sheets

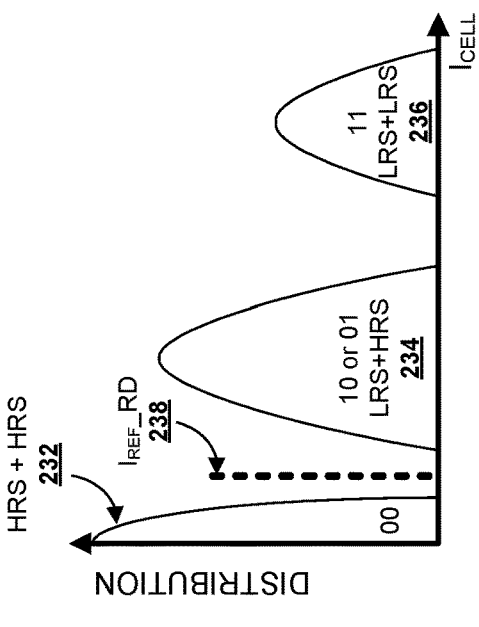
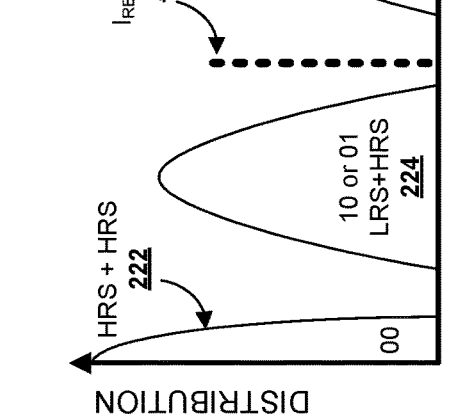
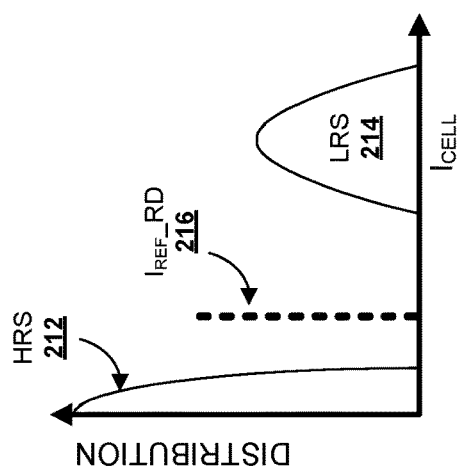
FIG. 2

LOGIC SUM: LOGICAL SUMMATION OF 'N' CELLS
300

LOGICAL AND-2 N = 2; FAVOR "00"
320

LOGIC AND-2    FAVOR "0"

| LOGIC AND-2 | N=2 ; AND-2 (HRS =0; LRS =1) | | OUTPUT BIT |
|---|---|---|---|
| CELL-A | CELL-B | | |
| 0 | 0 | | 0 |
| 0 | 1 | | 0 |
| 1 | 0 | | 0 |
| 1 | 1 | | 1 |

AND-2
340

LOGICAL OR-2 N = 2; FAVOR "11"
330

LOGIC OR-2    FAVOR "1"

| LOGIC OR-2 | N=2 ; OR-2 (HRS =0; LRS =1) | | OUTPUT BIT |
|---|---|---|---|
| CELL-A | CELL-B | | |
| 0 | 0 | | 0 |
| 0 | 1 | | 1 |
| 1 | 0 | | 1 |
| 1 | 1 | | 1 |

OR-2
350

1) B is a copy of A:     A<55:0> = B<55:0>

2) A is AND-ed with B:   Dout<55:0> = A AND B (AND-2)

3) Multi-Bit ECC:   D<31:0> = ECC<56:32> on Dout<55:0>

BER0_bit = BER0_cell^2

BER1_bit = BER1_cell x 2

1) B is a copy of A:     A<55:0> = B<55:0>

2) A is OR-ed with B:    Dout<55:0> = A OR B (OR-2)

3) Multi-Bit ECC:   D<31:0> = ECC<56:32> on Dout<55:0>

BER0_bit = BER0_cell x 2

BER1_bit = BER1_cell^2

LOGIC AND: 'N = 2'
Favors Correction of Erroneous '1'
400

412

| | MESSAGE | | | | | | | PARITY | | |
|---|---|---|---|---|---|---|---|---|---|---|
| | A | A | A | A | A | A | A | 9 | 3 | 1 | 5 | C | F |
| WRITE WORD-A 416 → | 1010 | 1010 | 1010 | 1010 | 1010 | 1010 | 1010 | 1001 | 1001 | 1000 | 1010 | 1100 | 1111 |
| WRITE WORD-B 418 → | 1010 | 1010 | 1010 | 1010 | 1010 | 1010 | 1010 | 1001 | 1001 | 1000 | 1010 | 1100 | 1111 |

'0' ERROR 420

'0' FLIP -> '1'

422

| | MESSAGE | | | | | | | PARITY | | |
|---|---|---|---|---|---|---|---|---|---|---|
| | A | A | A | A | A | A | A | 9 | 3 | 1 | 5 | C | F |
| READ WORD A<55:0> 426 → | 1110 | 1010 | 1010 | 1010 | 1010 | 1010 | 1010 | 1001 | 1001 | 1000 | 1010 | 1100 | 1111 |
| READ WORD B<55:0> 428 → | 1010 | 1010 | 1010 | 1010 | 1011 | 1111 | 1010 | 1001 | 1001 | 1000 | 1010 | 1100 | 1111 |
| Dout<55:0> = A AND B 429 → | 1010 | 1010 | 1010 | 1010 | 1010 | 1010 | 1010 | 1001 | 1001 | 1000 | 1010 | 1100 | 1111 |

'1' ERROR 430

'1' FLIP -> '0'       '1' FLIP -> '0'

432

| | MESSAGE | | | | | | | PARITY | | |
|---|---|---|---|---|---|---|---|---|---|---|
| | A | A | A | A | A | A | A | 9 | 3 | 1 | 5 | C | F |
| READ WORD A<55:0> 436 → | 1010 | 1010 | 1010 | 1000 | 0010 | 1010 | 1010 | 1001 | 1001 | 1000 | 1010 | 1100 | 1111 |
| READ WORD B<55:0> 438 → | 1010 | 1010 | 1010 | 1000 | 0010 | 1010 | 1010 | 1001 | 1001 | 1000 | 1010 | 1100 | 1111 |
| ECC FAIL: 5 bit errors 439 → | 1010 | 1010 | 1010 | 1000 | 0010 | 1010 | 1010 | 1001 | 1001 | 1000 | 1010 | 1100 | 1111 |

'1' FLIP -> '0' — Five bit Errors Following Logic 'AND'

TWO EXAMPLE LOGICAL SUMMATIONS OF 'N=4' CELLS
600

LOGICAL AND-4 N = 4; FAVOR "0"
620

LOGIC AND-4    FAVOR "0"

| | N=4 ; AND-4 (HRS =0; LRS =1) | | | |
|---|---|---|---|---|
| CELL-A | CELL-B | CELL-C | CELL-D | OUTPUT BIT |
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

BER0_bit = BER0_cell^4

BER1_bit = BER1_cell x 4

LOGICAL AND-3 N = 4; FAVOR "0"
630

LOGIC AND-3    FAVOR "0"

| | N=4 ; AND-3 (HRS =0; LRS =1) | | | |
|---|---|---|---|---|
| CELL-A | CELL-B | CELL-C | CELL-D | OUTPUT BIT |
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 0 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

BER0_bit = BER0_cell^3 * (1-BER0_cell)^1 * 4 + BER0_cell^4 * 1

BER1_bit = BER1_cell^2 * (1-BER1_cell)^2 * 6 + BER1_cell^3 * (1-BER1_cell)^1 * 4 + BER1_cell^4 * 1

FIG. 6

IMPROVEMENT OF BIT ERROR RATE PER CELL
700

| N #  702 | N = 1 | N = 4 AND-3 | | N = 2 AND-2 | | N = 2 OR-2 | |
|---|---|---|---|---|---|---|---|
| | | 704 | | 706 | | 708 | |
| BER TYPE 720 | BER 0/1 | BER 0 | BER 1 | BER 0 | BER 1 | BER 0 | BER 1 |
| USABLE ERROR 730 | 1000 ppm | > 60,000 ppm | > 10,000 ppm | > 30,000 ppm | 500 ppm | 500 ppm | > 30,00 ppm |

FIG. 7

SELECTION OF LOGIC CORRECTION AND N# FOR MTP AND OTP
800

| 802 DEFAULT | | 804 OPTION-A | | 806 OPTION-B | | 808 OPTION-C | | 810 OPTION-D | |
|---|---|---|---|---|---|---|---|---|---|
| MTP | OTP | MTP | OTP | MTP | OTP | MTP | OTP | MTP | OTP |
| N=1 | N=1 | N=2 AND-2 | N=1 | N=4 AND-3 | N=1 | N=2 AND-2 | N=2 OR-2 | N=4 AND-3 | N=2 OR-2 |

TRIM OPTIONS OR METAL OPTIONS TO SWITCH AMONG POR, OPTION-A, OPTION-B, OPTION-C, OPTION-D)

FIG. 8

FLEXIBLE AND CONFIGURABLE BIT ERROR RATE REDUCTION FOR NON-VOLATILE MEMORY

TECHNICAL FIELD

The subject disclosure relates generally to operations for controlling non-volatile memory, and as one illustrative example, configurable bit error reduction for non-volatile memory.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. The inventors believe that resistive-switching memory technology shows compelling evidence to hold substantial advantages over competing technologies in the semiconductor electronics industry.

Resistive-switching memory cells can be configured to have multiple states with measurably distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell can be correlated with logical information states, facilitating digital memory operations. Accordingly, arrays of many such memory cells can provide many bits of digital memory storage.

Resistive-switching memory can be induced to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to memory applications for electronic devices. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, continued development of practical utilizations of resistive-switching technology are pursued by the Assignee of the present disclosure.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various aspects of the subject disclosure provide for improved bit error correction for non-volatile memory. In some embodiments, the non-volatile memory can be resistive switching non-volatile memory, though the present disclosure is applicable to other modalities of non-volatile memory as well. Bit error correction can be implemented in multiple stages. As an example, bit error correction for a set of data can utilize a bitwise logic algorithm (e.g., digital logic; analog logic, combined digital and analog logic, etc.) or a differential algorithm applied to one or more copies (N) of the set of data to produce a logic (or differential) output. An error correction code (ECC) can be applied to the logic (or differential) output to produce corrected data that corrects bit errors of the set of data, if any, up to a maximum for the ECC selected. In some embodiments, a bitwise logic or differential algorithm can be selected to provide greater correction power for '0' state errors as opposed to '1' state errors. This can be implemented when a bit error rate is non-uniform for '0' state errors and '1' state errors. In further embodiments, a bitwise logic or differential algorithm, or a power of the algorithm (e.g., a value of N) can be selected based on a measurement of bit error rate. In still other embodiments, the bitwise logic or differential algorithm or the power of the algorithm can be specified in a host command supplied to a non-volatile memory device.

According to one or more additional embodiments of the present disclosure, provided is a method for reading a plurality of non-volatile memory cells. The method can comprise, in a first clock cycle: reading data values of a first set of non-volatile memory cells and reading second data values of a second set of non-volatile memory cells, wherein the second data values are one of: a complement of or a copy of, the data values. Further, the method can comprise, in a further clock cycle: performing a bitwise logic operation on the data values and the second data values and generating a logic output data set and executing an ECC algorithm on the logic output data set and correcting a bit error identified for the logic output data set.

In various additional embodiments, the present disclosure provides for a non-volatile memory device (e.g., a resistive switching non-volatile memory device; a floating gate non-volatile memory device, etc.). The memory device can comprise an array of non-volatile (NV) memory devices and a memory controller configured to read data contained within a plurality of NV memory devices of the array. Moreover, the memory controller can comprise an adaptive correction module configured to perform a digital or analog bitwise logic function upon a data pattern stored at the NV memory devices and generate a modified data pattern. Further, the memory controller can comprise an error correction code (ECC) module configured to execute an ECC algorithm that references parity data stored in parity bits associated with the NVRS memory devices and identifies and corrects a bit error in the modified data pattern.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 2 illustrates an analog summation and truth table for multiple memory cells utilized in part for correcting bit errors of a non-volatile memory device, in further embodiments;

FIG. 3 depicts truth tables for bitwise logical summation of multiple cells for correcting bit errors in the non-volatile memory device in yet other embodiments;

FIG. 4 illustrates an example bitwise logic correction and ECC to correct bit errors with greater correction capacity for '1' state errors, in an embodiment(s);

FIG. 6 illustrates truth tables for bitwise logic or logic and analog error correction with still greater correction capacity according to still further embodiments;

FIG. 7 depicts a table of improvement in bit error rate per cell according to various embodiments of the present disclosure;

FIG. 8 depicts a table for selectable Boolean logic operations for correction of bit error rates for many-time programmable (MTP) and one-time programmable (OTP) cells for various correction algorithms, in an embodiment(s);

DETAILED DESCRIPTION

Introduction

Figure 1:
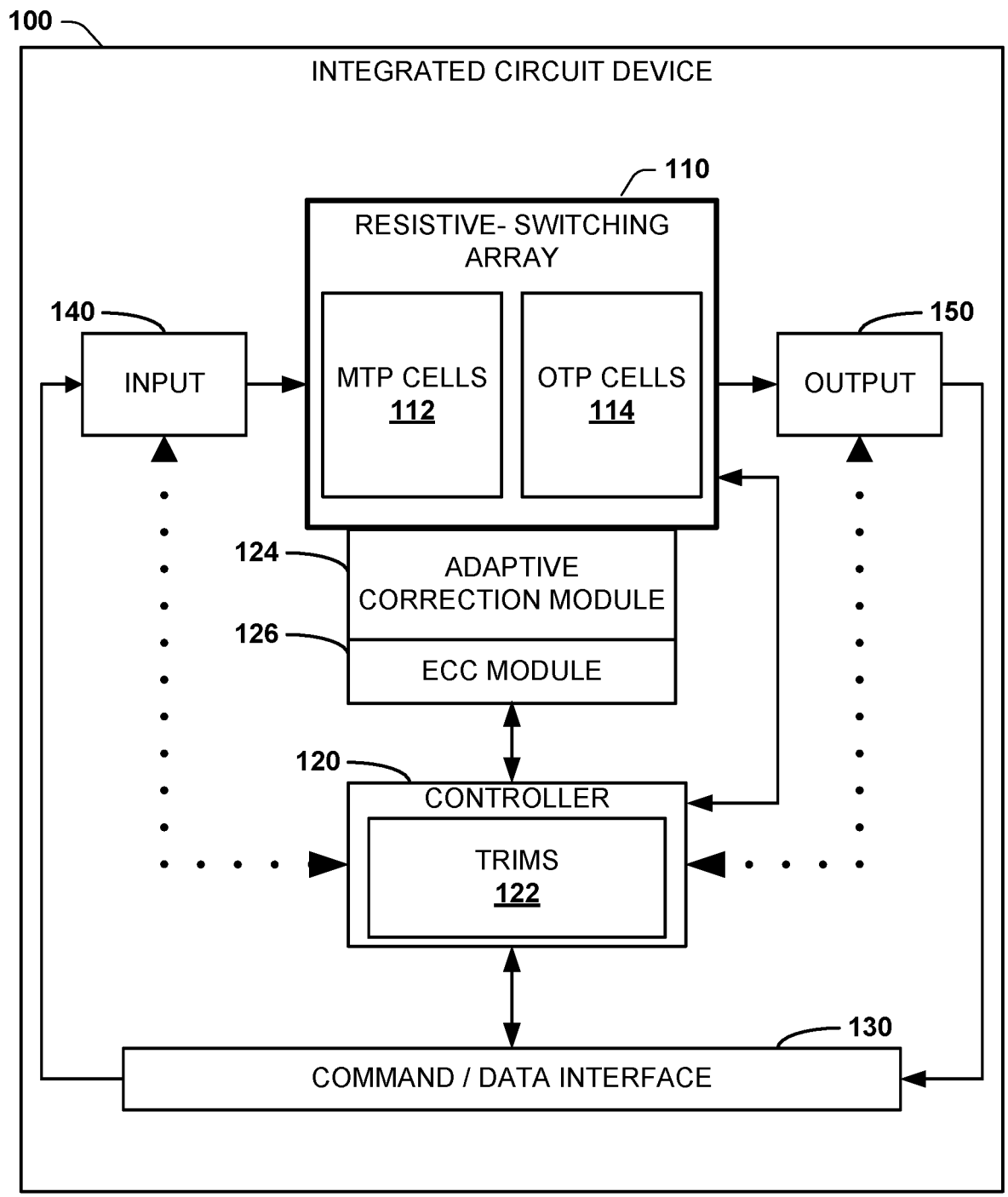
FIG. 1 illustrates a block diagram of an example integrated circuit device comprising a non-volatile memory device according to disclosed embodiments.

Various embodiments of the present disclosure provide for improvements in correcting bit errors in non-volatile memory. Disclosed bit error correction can be implemented for resistive switching non-volatile memory in one or more disclosed embodiments. The subject disclosure is not so limited however, and embodiments of the present disclosure can be applied to other non-volatile memory as well (e.g., floating gate memory; magnetic switching memory, and so forth). Various embodiments provide analog or digital bitwise logic algorithms suitable to mitigate or correct bit errors for binary data storage devices. Further, some disclosed analog or digital algorithms applicable to multiple, N (where N is a positive integer), copies of a set of data can have greater correction capacity for a particular bit state: a '1' state or '0' state. Aspects of the disclosed embodiments can select an algorithm that applies greater correction capacity to larger detected bit error rates for a bit state. As an example, where an error rate of the '1' state is detected as more likely than an error rate for the '0' state, an algorithm that applies greater correction capacity for the '1' state can be implemented. As another example, where the error rate of the '0' state is detected as more likely than the error rate for the '1' state, a second algorithm that applies greater correction capacity for the '0' state can be implemented. An error correction code (ECC) can be applied to an output of the analog or digital algorithm(s) and produce corrected data for the original set of data.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one of ordinary skill in the art, or a reasonable variation of a specified quality (ies) or quantity (ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of an integrated circuit device expressly identified as having a dimension of about 50 angstroms (Å), the relative term "about" can mean reasonable variances about 50 Å that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality (ies) or quantity (ies) that would be suitable to accomplish an explicitly disclosed function(s) or feature(s) of a disclosed element. Accordingly, the subject specification is by no means limited only to specific qualities and quantities disclosed herein, but includes all variations of a specified quality (ies) or quantity (ies) reasonably conveyed to one of ordinary skill in the art by way of the context disclosed herein. In addition to the foregoing, the term logic algorithm, whether analog or digital refers to a bitwise logic algorithm unless clear from context to the contrary.

In one or more disclosed embodiments, a resistive switching memory device can be a two-terminal non-volatile resistive switching device. As the name implies, a two-terminal memory device has two terminals or electrodes. Herein, the terms "electrode" and "terminal" are used interchangeably. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device.

Composition of memory cells, generally speaking, can vary per device with different components, materials or deposition processes selected to achieve desired characteristics (e.g., stoichiometry/non-stoichiometry, on/off current ratio, switching time, read time, memory durability, program/erase cycle, and so on). One example of a conductive bridge random access memory (RAM) or programmable metallization cell device can comprise: a relatively (electrochemically) inert conductive layer, e.g., metal, metal-alloy, metal-nitride, etc. (e.g., comprising W, Ni, Pt, $Ti_xN_y$, (where x and y are respective suitable positive numbers), Ir, or other suitable metal compounds) and an electrochemically active conductive layer, e.g., metal, metal-alloy, metal-nitride, etc. (e.g., comprising $Al_xN_y$ (e.g., non-stoichiometric and conducting), Ag, Cu, or other suitable metal compounds), separated by a resistive switching layer (RSL) (e.g., comprising $Al_xO_y$, $Si_xO_y$, $Ti_xO_y$, or other suitable oxide). Under suitable conditions, the active metal-containing layer can provide filament-forming ions (e.g., Al, Ag, Cu, etc.) to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a programmable metallization cell, conductive bridge RAM, or a filamentary-based device.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. For a one-time programmable (OTP) memory device, the structure of metal particles can be made much thicker and denser than a many-time programmable (MTP) memory device. For instance, the former can be made to resist deformation of the filamentary conductive structure embodied by the metal particles and therefore effectively rendering a low resistance state permanent or at least substantially permanent (e.g., significantly lowering a bit error rate in which the low resistance state reverts to a high resistance state).

Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

Overview

For memory devices having switching characteristics based upon the presence or absence of a conductive filament(s) therein to change the resistance of the memory device between a low resistance state (filament present) and a high resistance state (filament disrupted), retention problems (short-term memory erase failures) can occur in some memory devices. Such failures include an erase disturb condition, which involves erasing a memory typically with a negative voltage, and after an amount of time, having the memory by itself return to a programmed state (e.g., from a high resistance state to a low resistance state). The opposite condition is a program disturb condition, in which a conductive filament formed within a switching layer loses electrical continuity and returns to a high resistance state (e.g., an unprogrammed state). The erase disturb condition is also referred to herein as a '0' state error, and the program disturb condition is also referred to herein as a '1' state error.

In addition to the foregoing, the frequency of bit errors can change as a process technology utilized to manufacture a switching device matures. For instance, a memory array embedded within an integrated circuit may have a first bit error rate for early manufacturing runs of the integrated circuit. However, the process for fabricating the memory array may improve over time in a manner that reduces the bit error rate. Subsequent manufacturing runs for the same integrated circuit may therefore have lower bit error rates, because the memory array is fabricated with improvements to its manufacturing process.

In addition to the foregoing, a bit error rate for a given memory technology can change with a number of program-erase or a number of rewrite (e.g., overwrite) cycles applied to respective memory cells of an array. Thus, some cells within the array might have a different bit error rate than other cells within the same array and produced by the same process technology. Moreover, this bit error can continue to change for different cells in the array as cell cycles continue to increase. A disclosed memory controller (e.g., memory controller 120 of FIG. 1, infra) can be configured to track cycle counts for different segments of a memory array (e.g., resistive-switching array 110). Cycle count may be updated and stored in individual cycles, or groups of cycles (e.g., tens of cycles, hundreds of cycles, thousands of cycles, fifty cycles, multiples of 16, 32, 64 or 128 cycles, and so forth). Moreover, cycle count can be stored for different cells, different words of memory, different pages of memory, different blocks of memory, or a suitable combination of the foregoing.

Aspects of the disclosed embodiments describe algorithms utilized in conjunction with error correction code (ECC) to further enhance the corrective scope of the ECC. In some embodiments, the algorithms can be weighted to have greater corrective capacity for a program state than an erase state, or vice versa. Other algorithms can have greater corrective capacity for either state. In further embodiments, a bit error rate can be measured and a corrective algorithm selected based on the bit error rate and a skew in error rate for one binary state versus another binary state. An output of the corrective algorithm can be supplied to the ECC for final correction of any remaining bit errors.

FIG. 1 illustrates a block diagram of an example integrated circuit device 100 according to embodiments of the present disclosure. Integrated circuit device 100 can comprise an array of non-volatile memory, such as resistive-switching array 110. A memory controller coupled to resistive-switching array 110 can be configured to perform memory operations on memory cells within resistive-switching array 110 according to signal specifications stored in trim settings 122. Suitable memory operations and signal specifications can include a program operation, an erase operation, an overwrite operation and a read operation for many-time programmable (MTP) memory cells 112, as well as a program operation and a read operation for one-time programmable (OTP) memory cells 114.

Embodiments of the present disclosure are not limited to resistive-switching memory technologies for array 110, in various disclosed embodiments. Rather, integrated circuit device 100 and other disclosed embodiments can utilize non-volatile memory in general, where suitable. Thus, non-volatile two-terminal memory (e.g., magnetic switching memory, among others) can be utilized instead of resistive-switching memory, in some embodiments. In at least some embodiments, floating gate non-volatile memory could be utilized for array 110. Accordingly, where understood by one of skill in the art, resistive-switching array 110 could be interchanged with non-volatile memory in general without departing from the scope of the present disclosure.

Figure 9:
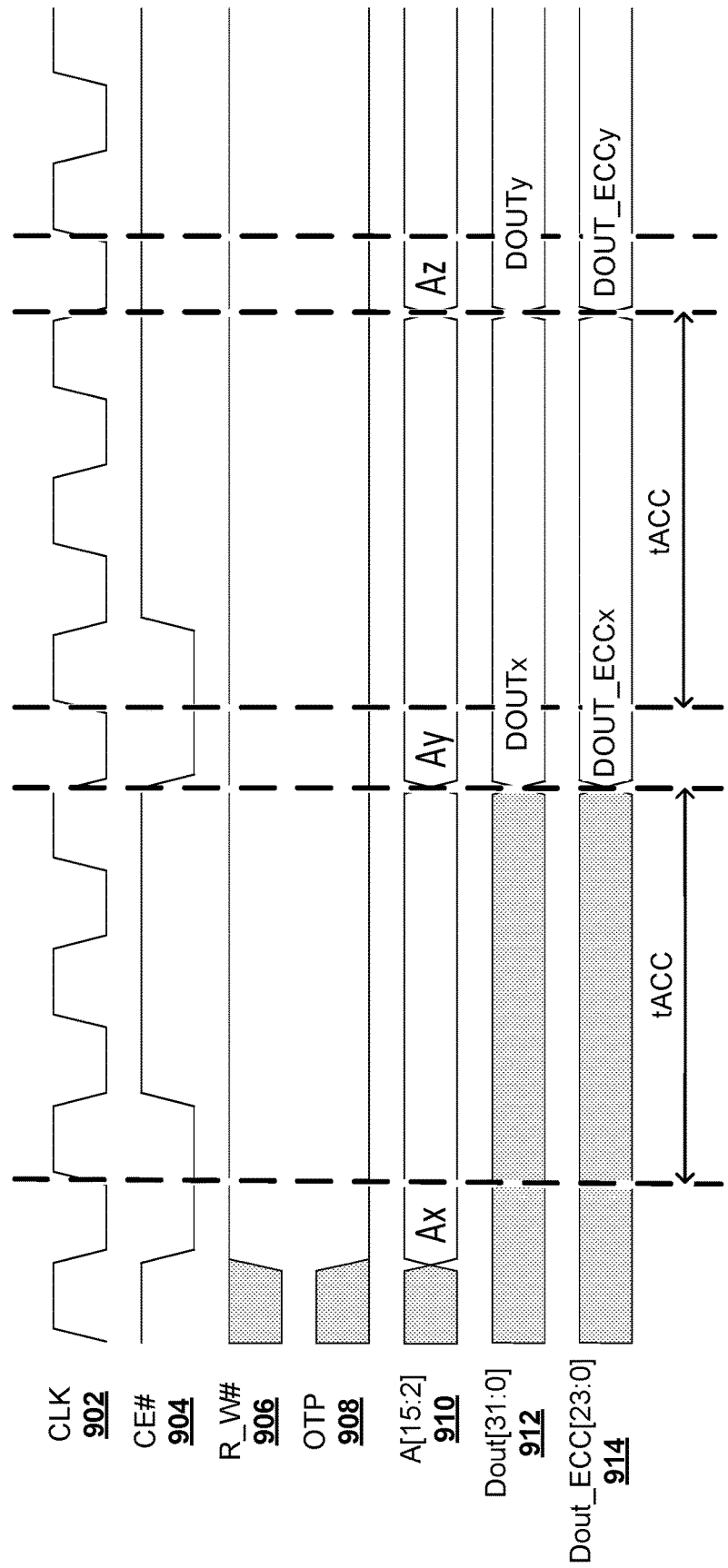
FIG. 9 depicts a timing diagram of an example three-clock read cycle for correcting data stored in non-volatile memory in one or more embodiments.

In addition to the foregoing, trim settings 122 can store signal specifications for data bit correction associated with a read operation (e.g., see FIG. 9, infra). Data bit correction can utilize ECC correction implemented by an ECC module 126 in described embodiments. Further, data bit correction can utilize an adaptive correction of a set of correction algorithms described herein and implemented by an adaptive correction module 124. In some embodiments, a setting(s) (e.g., an N number) for a correction algorithm can be stored in trim settings 122. In further embodiments, a correction algorithm selection of the set of correction algorithms can be stored in trim settings 122. In still further embodiments, criterion (or criteria) for selecting one of the set of correction algorithms as the correction algorithm selection can be stored in trim settings 122. An example of such a criterion is a bit error rate for a set of data cells from which data is to be read for the read operation. Another example criterion is a '0' state error rate, and yet another example criterion is a '1' state error rate for the set of data cells. A further example criterion is a skew in error rate (e.g., a proportion of error rate, or other suitable mathematical or qualitative relationship) for the '1' state versus the '0' state. In other examples, criteria including a combination of the foregoing criterion or like criterion (e.g., a program cycle count of a set of data cells, a switching implementation or switching type of the set of data cells, etc.) within the scope of the present disclosure.

Upon determining a suitable correction algorithm, memory controller 120 can execute the read algorithm utilizing signal specifications stored in trim settings 122. During the read operation, a selected correction algorithm can be applied to a set of data as described herein, and an output of the selected correction algorithm generated. An ECC can then be implemented on the output of the selected correction algorithm to produce corrected data for the read algorithm. One example of signal specifications for such a read algorithm is provided at FIG. 9, infra). Characteristics of signal specifications for the read algorithm stored in trim settings 122 can include signal timing, signal magnitude, signal pulse duration, number of signal pulses, among others, as would be understood by one of skill in the art or reasonably conveyed to one of skill in the art by way of the context provided herein.

Also illustrated in integrated circuit device 100 is an input(s) 140 and output(s) 150. In some embodiments, input(s) 140 can include (or provide a pathway for) data to be stored within resistive-switching array 110. Output(s) 150 can output data stored within and retrieved from resistive-switching array 110 by memory controller 120, e.g., as part of a read operation. In some embodiments, output(s) 150 can output corrected data for a set of data targeted by a read operation. Such a read operation can be specified by a host device communicatively connected to integrated circuit device 100 by way of command/data interface 130, and the set of data can also be specified by the host device in one or more disclosed embodiments.

Command/data interface 130 is provided to receive commands (e.g., application-related commands, memory commands, error correction commands, etc.) and command parameters (e.g., selection of a correction algorithm—such as options A, B, C, D, and so forth of FIG. 8, infra-selection of N number, selection of single-bit or multi-bit ECC, or the like) from an external device and respond to those commands. As one example, a read operation and memory cell addresses for the read operation can be received over command/data interface 130. In addition to the foregoing, data to be written to resistive switching array 110 can be received by way of command/data interface 130, and data output from resistive-switching array 110 can be provided over command/data interface 130. In at least some embodiments, memory controller 120 can dynamically expose resistive switching array 110 to an external host device (separate from integrated circuit device 100—not depicted; but see FIG. 13, infra) by way of command/data interface 130. In such embodiments the external host device can select subsets of resistive-switching array 100 for implementing an application, a data operation, a memory operation, or the like. In various example implementations, the external host device can be manufactured separately and communicatively interconnected by one or more network or device interfaces to command/data interface 130 to accomplish this embodiment(s).

FIG. 2 depicts distribution diagrams and truth tables for example analog summation algorithms 200 according to embodiments of the present disclosure. The distribution diagrams represent a population of bits defined by a number, N, of memory cells, such as memory cells of resistive-switching array 110 of FIG. 1. In more detail, the distribution diagrams chart a number (or distribution) of the bits on a vertical axis against a magnitude of electrical current conducted by N memory cells on the horizontal axis. For a given electrical current then, the distribution curves show a number of bits having that electrical current within the population of memory cells represented by the graph. Note that distribution diagrams of FIG. 2 are representative only and do not depict actual measured cell currents, nor are they drawn to scale.

The N=1 analog summation 210 is shown on the left side and graphs electrical current for a bit consisting of a single memory cell having one of two binary states: a high resistance state represented by HRS curve 212 and a low resistance state represented by LRS curve 214. The respective HRS curve 212 and LRS curve 214 represent distributions of bits comprising a single memory cell, and the current conducted by bits within those distributions. HRS curve 212 includes memory cells in a high resistance state and their electrical currents are in a relatively small distribution at or slightly above zero. LRS curve 214 includes memory cells in a low resistance state and their electrical currents are in a second distribution larger than zero, and also larger than any electrical current for the HRS curve 212. Thus, a reference current: $I_{REF\_}RD$ 216 positioned at an electric current value between HRS curve 212 and LRS curve 214 can successfully distinguish all memory cells in the high resistance state from all memory cells in the low resistance state. By distributing $I_{REF\_}RD$ 216 nearer LRS curve 214 greater preference can be given to identifying a memory cell as a high resistance state cell, whereas distributing $I_{REF}$ RD 216 nearer HRS curve 212 greater preference can be given to identifying a memory cells as a low resistance state cell. This preference can be referred to as analog distribution preference (also referred to herein as an analog differential preference) that favors a '0' state (high resistance state) or a '1' state (low resistance state).

Referring now to analog AND-2 summation 220, each bit is defined by multiple N=2 memory cells. When operating upon a target set of memory cells for a read operation, a first memory cell of each bit can be a target cell for the read operation, and a second memory cell of each bit can be an adjacent cell within resistive-switching array 100, such as a cell sharing a neighboring bitline, a cell sharing a neighboring wordline, a cell sharing a neighboring source line, and so forth, depending on a layout of resistive-switching array 110. The electrical current of each cell is summed to produce an electrical current of each N=2 bit, as is described below.

A distribution of N=2 bits is portrayed on a vertical axis of the associated graph and (summed) electrical current is portrayed on a horizontal axis of the graph. More specifically, the electrical current is the sum of electrical currents for the N=2 memory cells defining each bit. For binary non-volatile memory states: a '0' state and a '1' state, there are three distributions of such N=2 bits. Bits having two memory cells with a high resistance state are represented by HRS+HRS curve 222, bits having one low resistance state and one high resistance state cell are represented by LRS+HRS curve 224 and bits having two high resistance states are represented by LRS+LRS curve 226. To model a binary AND operation as embodied by truth table AND-2 240, a current reference $I_{REF\_}RD$ 228 can be positioned between HRS+LRS curve 224 and LRS+LRS curve 226 as shown. When positioned in this manner, any (summed) current below $I_{REF}$ RD 228 can define a '0' output bit whereas current above $I_{REF\_}RD$ 228 can define a '1' output bit, matching the AND-2 240 truth table. The output bits represented by AND-2 240 truth table can be substituted for memory states stored by the target set of memory cells for the read operation, introduced above, to induce a preference for the '0' state over the '1' state inherent in the AND-2 240 truth table. This preference is defined by the algorithm below in conjunction with the logical AND truth table of FIG. 3, infra. In addition to this preference inherent to the truth table, further adjustment to the preference for '0' state or '1' state of the output bit can be implemented with the analog differential preference associated with adjusting location of $I_{REF\_}RD$ 228 between LRS+HRS curve 224 and LRS+LRS curve 226 as discussed above.

Referring now to analog OR-2 summation 230, each bit is defined by multiple N=2 memory cells. Similar to AND-2 summation 220, each bit can be defined by a target cell for a read operation and an adjacent cell within resistive-switching array 110. For instance, where a read operation targets a word consisting of 32 memory cells, an additional 32 memory cells respectively adjacent to one of the targeted 32 memory cells can be read together with the targeted 32 memory cells by memory controller 120 (e.g., utilizing instructions, logic or circuitry at adaptive correction module 124, optionally utilizing one or more settings stored in trims 122, such as the N=2 value). Measured electrical current of pairs of adjacent memory cells can be attributed to the output of each N=2 bit, represented by the respective distribution curves of OR-2 summation 230. Specifically, HRS+HRS curve 232 represents (summed) electrical current of two memory cells in the high resistance state, LRS+HRS curve 234 represents (summed) electrical current of one memory cell in the high resistance state and one memory cell in the low resistance state, and LRS+LRS curve 236 represents (summed) electrical current of two memory cells in the low resistance state. To model a binary OR operation as embodied by truth table OR-2 250, a current reference $I_{REF\_}RD$ 238 can be positioned between HRS+HRS curve 232 and HRS+LRS curve 234 as shown. As a result, any (summed) current below $I_{REF}$ RD 238 can define a '0' output bit whereas current above $I_{REF\_}RD$ 238 can define a '1' output bit, matching the OR-2 250 truth table.

As noted above, output bits represented by OR-2 250 truth table can be utilized as memory states stored by the target set of memory cells for the read operation, inducing a preference for a '1' state over the '0' state inherent to the OR-2 250 truth table. This preference is defined by the algorithm disclosed with the logical OR truth table of FIG. 3, infra. Additionally, the preference for '1' state inherent to OR-2 250 truth table can be modified with analog differential preference associated with adjusting location of $I_{REF\_}RD$ 238 between LRS+HRS curve 234 and HRS+HRS curve 232 as described herein.

In one or more further embodiments, an output of analog summation algorithms 200 for memory cells identified by a read operation can be provided to an ECC algorithm. The ECC algorithm can utilize parity bits associated with the identified memory cells to detect and correct one or more bit errors in the output of analog summation algorithms 200. Thus, one or more bit errors remaining in the output following analog summation algorithms 200 can be corrected utilizing ECC. In some disclosed embodiments, a disclosed memory controller such as memory controller 120 can be configured to measure or otherwise determine a bit error rate associated with resistive-switching array 110, or subsets of resistive-switching array 110. A correction algorithm (e.g., AND algorithm, OR algorithm, or others such as an XOR algorithm or other suitable truth table) can be selected suitable to the measured bit error rate. In still further embodiments, a correction parameter of the correction algorithm (e.g., N=1, N=2, N=3, N=4, etc.) can be selected by memory controller 120 (or adaptive correction module 124) to provide corrective power matching or approximating the measured bit error rate (e.g., see FIGS. 8 and 9, infra). In still further embodiments, a skew or difference in bit error rate for '0' state memory cells (also referred to herein as 0 bit error rate, or BER0) and bit error rate for '1' state memory cells (also referred to herein as 1 bit error rate, or BER1) can be determined by memory controller 120. The correction algorithm (e.g., AND, OR) or correction parameter (e.g., N=1, 2, . . . ) can be selected at least in part to match or approximate the skew in BER0 and BER1.

FIG. 3 depicts example logical summation algorithms 300 and associated truth tables according to further embodiments of the present disclosure. Shown are truth tables, 340 and 350 respectively, for a logical AND-2 algorithm 320 with N=2, and for a logical OR-2 algorithm also with N=2. Similar to analog summation algorithms 200, AND-2 algorithm 320 favors a '0' state error—and therefore gives greater corrective power to the '0' state; see below—whereas OR-2 algorithm 350 favors (and gives greater corrective power) to a '1' state error. Accordingly, a memory controller could select AND-2 algorithm 320 to correct bit errors when measured BER0>measured BER1. Conversely, OR-2 algorithm 330 can be selected when measured BER1>measured BER2.

Similar to analog summation algorithms 200, N=2 defines a bit having two memory cells. Rather than summing electrical current of the N cells and comparing to a reference current as described above, however, logical summation algorithms 300 determine an output for each bit by implementing a logical AND operation or logical OR operation on memory states of the N memory cells. Thus, for instance, with a read operation involved 32 target memory cells, the 32 target memory cells are allocated to a 32-bit A matrix [32:1] (e.g., by memory controller 120, or adaptive correction module 124, etc.) and a second set of 32 memory cells are allocated to a second 32-bit B matrix [32:1]. The memory cells of matrix B can be adjacent to the target memory cells, but need not be. Rather, such memory cells can be located anywhere within resistive-switching array 110. Moreover, memory cells of matrix B contain a copy of a data pattern stored in the target memory cells of matrix A, but can also have data errors independent of data errors present in matrix A (e.g., see FIGS. 4 and 5, infra).

To implement logical AND-2 320, first: a copy of a target set of memory cells is saved into (or retrieved from) N−1 additional sets of the memory cells, in this case a single additional set of such memory cells. The target set of memory cells defines matrix A and the N−1 additional sets define additional matrices, in this case just one: matrix B. Second: data matrix A is conjoined with matrix B, represented mathematically as: A∧B (equivalent to: A·B in electronic syntax). The output of A∧B for each N=2 bit is shown in the right-most column of AND-2 truth table 340 of AND-2 algorithm 320. Third: the output of A∧B can then be subjected to an ECC algorithm. The ECC can be a multi-bit ECC as shown in FIG. 3 (e.g., a BCH<56:32> algorithm), or can be a single bit ECC in other disclosed embodiments. Examples of suitable ECC include Bose-Chaudhuri-Hocquenghem (BCH) code, Hamming code and Reed-Solomon (RS) code, though other single and multi-bit ECC codes known in the art or suitable combinations of the foregoing can be implemented as alternative embodiments of the present disclosure.

The corrective power of logical AND-2 320 is shown by equations below AND-2 truth table 340. Specifically, for '0' state bit errors: BER0_bit=BER0_cell^2. In other words, a number of '0' state bit errors for N=2 memory cells is equal to the square root of the '0' state cells errors. This is a significant reduction in '0' state errors, illustrating how logical AND-2 algorithm 320 achieves high corrective power for '0' state bit errors, or BER0. The corrective power of logical AND-2 320 is BER1_bit=BER1_cell*2. Stated differently, a number of '1' state bit errors for N=2 memory cells is equal to half the '1' state cell errors. This is also a significant reduction in BER1, though less than for BER0. Thus, logical AND-2 320 could be quite helpful upon determining bit error for a subset of memory cells of resistive-switching array 110 have BER0>BER1. If this skew in bit error changes over time, for instance with increasing cycle count or with improvements in resistive-switching process technology for later runs of integrated circuit device 100, a different analog, logical or differential correction algorithm, a different N value, or the like can be selected by memory controller 120 instead, to match or approximate the different bit error rate, or the skew in bit error rate.

To implement logical OR-2 330, first: a copy of a target set of memory cells is saved into (or retrieved from) N−1 additional sets of memory cells, in this case a single set of additional memory cells. The target set of memory cells defines matrix A and the additional set defines matrix B, similar to that described above. Second: data matrix A is disjoined with matrix B, represented mathematically as A ∨ B (or electronically as A+B). The output of A ∨ B for each N=2 bit is shown in the right-most column of OR-2 truth table 350 of OR-2 algorithm 330. Third: the output of A ∨ B can then be subjected to an ECC algorithm (e.g., BCH<56:32>) to produce corrected output.

The corrective power of logical OR-2 330 is shown by equations below OR-2 truth table 350. Specifically, BER0_bit=BER0_cell*2 and BER1_bit=BER1_cell^2. Said differently, bits of N=2 memory cells have a square root reduction in '1' state errors, and reduction by half of '0' state errors in response to OR-2 algorithm 330. This is the inverse of AND-2 algorithm 320, and can be selected by memory controller 120 upon measuring greater '1' state bit errors BER1 than '0' state bit errors BER0.

FIG. 4 illustrates an example of AND-2 bit correction 400 associated with logic AND-2 algorithm 320 and its relative correction power favoring BER0 (also referred to as an erroneous '1' state in FIG. 4). AND-2 bit correction 400 involves an example write word A 416, having thirty-two bits under message 412. Twenty-four parity bits 414 are defined for message 412 in the example shown, corresponding to a BCH <56:32> error correction algorithm (56 total bits, with 32 message bits; this leaves 24 parity bits).

A second write word B 418 is stored at an additional thirty-two bits, comprising a copy of the data set stored in write word A 416. BER0 errors 420 are inserted into matrix A <55:0> 426 in message 422, including five '0' bit errors in which a '0' bit is erroneously become a '1' bit (depicted by shaded '1's, differing from respective '0' values in write word A 416). Moreover, additional BER0 errors 420 are inserted into matrix B <55:0> 428 in five different bit locations, also shown as '0' states flipped (erroneously) to '1' states by shaded backing. Dout<55:0> 429 represents an output of A∧B (including parity bits 424) resulting in no bit errors. Specifically, Dout<55:0> matches write word A 416 exactly. This illustrates the corrective power of AND-2 algorithm 320 favoring BER0 (or erroneous '1' state). Note that ECC can be performed on Dout<55:0> (utilizing parity bits 424) and will produce a correct output word, but no bit errors will be detected.

In contrast, BER1 errors 430 are inserted into message 432, including two bit errors for matrix A <55:0> 436 and three additional bit errors inserted for matrix B <55:0> 438. These also are denoted by shaded background with '1' bits flipped to '0' in message 432. Dout<55:0> is produced following A∧B (bits shown in gray in the third row of message 432, including parity bits 434). Despite there being half as many BER1 errors, Dout<55:0> produces five bit errors, which results in an ECC fail 439, despite the use of parity bits 434.

Figure 5:
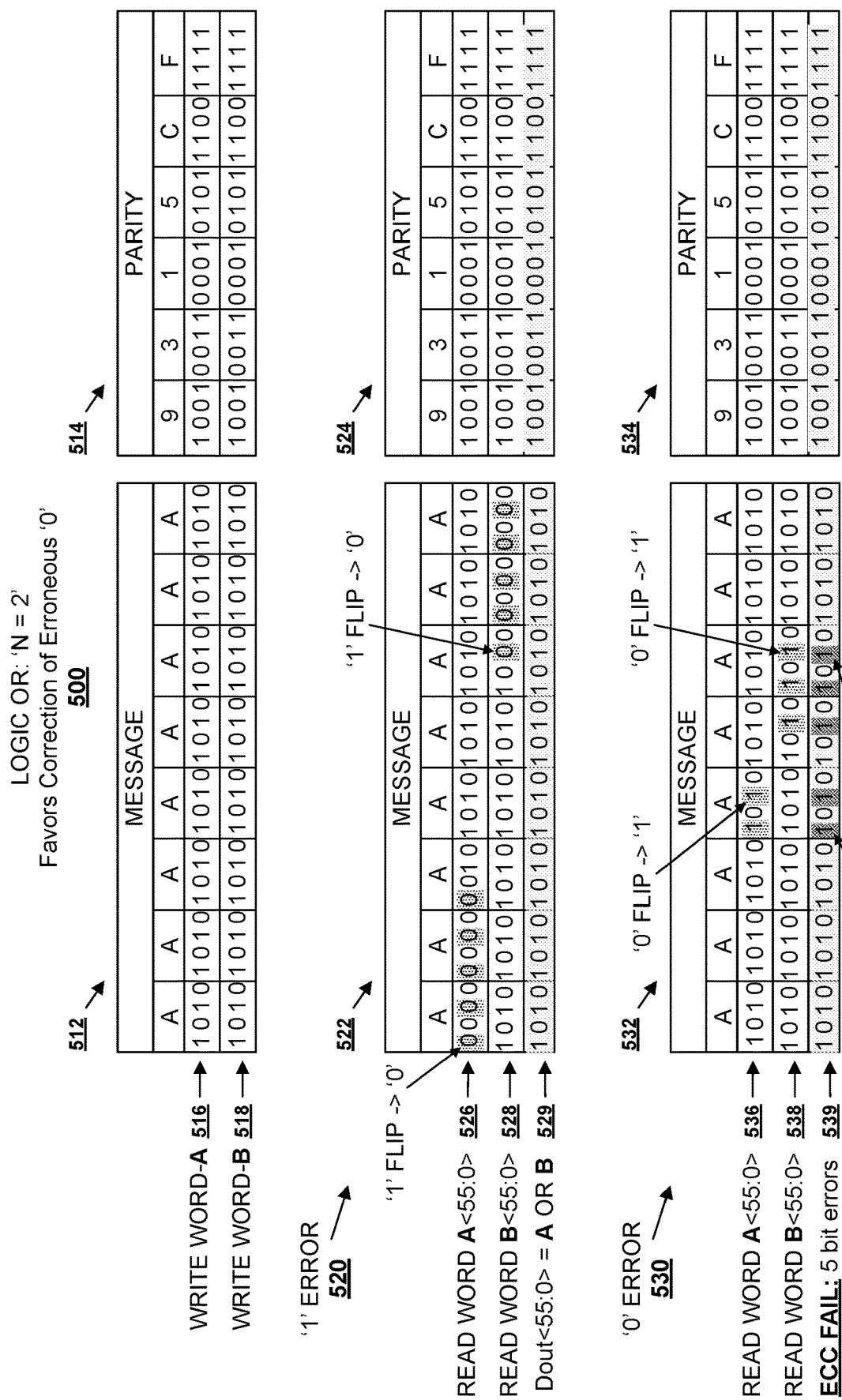
FIG. 5 depicts a sample bitwise logic correction and ECC to correct bit errors with greater correction capacity for '0' state errors according to further embodiments.

FIG. 5 illustrates an example OR-2 bit correction 500 associated with logic OR-2 algorithm 330 and its relative correction power favoring BER1 (also referred to as an erroneous '0' state in FIG. 5). OR-2 bit correction 500 involves an example write word A 516, having thirty-two bits under message 512. Twenty-four parity bits 514 are defined for message 512 in the example shown, corresponding to a BCH<56:32> error correction algorithm.

A second write word B 518 is stored at an additional thirty-two bits, comprising a copy of the data set stored in write word A 516. BER1 errors 520 are inserted into matrix A <55:0> 526 in message 522, including five '1' bit errors in which a '1' bit is erroneously become a '0' bit (depicted by shaded '0's, differing from respective '1' values in wrote word A 516). Moreover, additional BER1 errors 520 are inserted into matrix B <55:0> 528 in five different bit locations, also shown as '1' states flipped (erroneously) to '0' states by shaded backing. Dout<55:0> 529 represents an output of A v B (including parity bits 524) resulting in no bit errors. Specifically, Dout<55:0> matches write word A 516 exactly. This illustrates the corrective power of OR-2 algorithm 330 favoring BER1 (or erroneous '0' state). Note that ECC can be performed on Dout<55:0> utilizing parity bits 524 and will detect no errors.

In contrast, BER0 errors 530 are inserted into message 532, including two bit errors for matrix A <55:0> 526 and three additional bit errors inserted for matrix B <55:0> 538. These also are denoted by shaded background with '0' bits flipped to '1' in message 532. Dout<55:0> is produced following A v B (bits shown in gray in the third row of message 532 and for parity bits 534). Despite there being half as many BER0 errors, Dout<55:0> produces five bit errors, which results in an ECC fail 539, despite the availability of parity bits 534.

FIG. 6 illustrates truth tables of example logic summation algorithms 600 according to further embodiments of the present disclosure. Two logic summation algorithms are shown, each with N=4. For a logic AND or OR algorithm, the N=4 parameter specifies a number (N−1) of copies of a target group of memory cells utilized for the logic operation. Specifically, a first N=4 logical summation: AND-4 algorithm 620 conjoins four copies of read data and a second N=4 logical summation: NAD-3 algorithm 630 conjoins three copies of read data as defined in their respective truth tables. Corrective power for AND-4 algorithm 620 is provided by the bit error rate algorithms: $BER0\_bit=(BER0\_cell)^4$, and $BER1\_bit=BER1\_cell*4$. Thus, AND-4 algorithm 620 provides a fourth power reduction in cell error for '0' state errors, and a multiple of four reduction in '1' state errors. Corrective power for AND-3 algorithm 630 is also shown: $BER0\_bit=(BER0\_cell)^3*(1-BER0\_cell)^1*4+(BER0\_cell)^4*1$ for '0' bit state errors. Additionally, the '1' state corrective power for AND-3 algorithm 630 is defined by: $BER1\_bit=(BER1\_cell)^2*(1-BER1\_cell)^2*6+(BER1\_cell)^3*(1-BER1\_cell)^1*4+(BER1\_cell)^4*1$.

In various embodiments of the present disclosure, a hybrid logic+analog mechanism can be utilized to achieve higher corrective powers of larger N numbers, with fewer copies of memory cells. For instance, an analog and differential N=2 can be combined with a logic N=2 to generate an AND-4 hybrid algorithm. Two examples are provided in table 1 and table 2 below:

TABLE 1

| Cell-A0 | Cell-A1 | Cell-A2 | Cell-A3 | Cell-A4 | Cell-A5 | Cell-A6 | Cell-A7 |
|---|---|---|---|---|---|---|---|
| SUM A0 + A1 = B0 | | SUM A2 + A3 = B1 | | SUM A4 + A5 = B2 | | SUM A6 + A7 = B3 | |
| DIFF B0 − B1 = C0 | | | | DIFF B2 − B3 = C1 | | | |
| LOGIC AND C0 + C1 = DOUT | | | | | | | |

TABLE 2

| Cell-A0 | Cell-A1 | Cell-A2 | Cell-A3 | Cell-A4 | Cell-A5 | Cell-A6 | Cell-A7 |
|---|---|---|---|---|---|---|---|
| DIFF A0 − A1 = B0 | | DIFF A2 + A3 = B1 | | DIFF A4 + A5 = B2 | | DIFF A6 + A7 = B3 | |
| SUM B0 + B1 = C0 | | | | SUM B2 + B3 = C1 | | | |
| LOGIC AND C0 + C1 = DOUT | | | | | | | |

FIG. 7 provides a bit error rate table 700 identifying bit error rates referenced against example correction algorithms. The bit error rates include '1' bit error rates for different correction algorithms, as well as ratios of '1' bit error rate to '0' bit error rate: BER1/BER0 for AND-3 correction algorithms.

As shown table 700 includes columns specifying different Boolean logic operations and rows providing bit error rate (BER) 720 and usable error 730 for different N number 710. As utilized herein, usable error 730 refers to a number of bit errors, as shown by BER0 and BER1 headings, that can be reduced or corrected to a default bit error upon application of an associated Boolean logic operation. The default bit error is an example bit error for '0' or '1' states for an N=1 Boolean (effectively no Boolean). A first column 702 is the N=1 having no Boolean logic applied to a set of data, and a default error rate associated there with. Note that the default error rate of 1000 ppm is exemplary only; sets of data having various other error rate numbers (e.g., any number between 1 and 999,999 ppm; any number between 1 and ~15,000 ppm, and so forth) with no Boolean correction algorithm are all within the scope of the present disclosure, and thus will correspond with different values of reducible bit errors for the Boolean operations shown. A second column 704 provides BER0 and BER1 values that can be corrected to 1000 ppm following an N=4 AND-3 Boolean operation, a third column 706 provides BER0 and BER1 values that can be corrected to 1000 ppm following an N=2 AND-2 Boolean operation, and a fourth column 708 provides BER0 and BER1 values that can be corrected to 1000 ppm following an N=2 OR-2 Boolean operation.

FIG. 8 illustrates a table 800 providing selection options for logic correction algorithms and associated N number for MTP and OTP non-volatile memory cells. Selection options include a default 802 with N=1 for both MTP and OTP cells. Option-A 804 specifies N=2 and a Boolean logic AND-2 for MTP cells and an N=1 for OTP cells. Option-B 806 specifies N=4 and a Boolean logic AND-3 for MTP cells and N=1 for OTP cells. Option-C 808 specifies N=2 and Boolean logic AND-2 for MTP cells and N=2 and Boolean logic OR-2 for OTP cells. Finally, Option-D 810 provides N=4 and Boolean logic AND-3 for MTP cells and N=2 with Boolean logic OR-2 for OTP cells. The selection options can be selected in trim settings 122 or in metal or circuitry switches in memory controller 120, or the like.

FIG. 9 depicts an example timing diagram 900 for an example read operation according to further embodiments of the present disclosure. Signal settings associated with timing diagram 900 can be stored in trim instructions 122 in one or more embodiments, though the subject disclosure is not so limited. In the example illustrated in FIG. 9, timing diagram 900 is a three-clock read cycle for reading data, executing a correction algorithm to generate an output data and executing an ECC on the output data to produce corrected data for the read operation.

Timing diagram 900 shows relative timing of various signals affecting an array as part of a read operation for resistive-switching memory. Clock signal timing is shown by clk 902, relative to CE #904, R_W #906 and OTP 908. OTP 908 can be embodied by an input pin, in one or more disclosed aspects, and can specify whether data being read from memory cells at a specified read address is from MTP memory cells or from OTP memory cells. As an example: for OTP pin 908=0 the read address can contain MTP memory cells and for OTP pin 908=1 the read address can contain OTP memory cells. In various embodiments, a state of OTP pin 908 can be utilized at least in part for selecting a bitwise logic operation to be implemented on a set of non-volatile memory cells. For instance, a first bitwise logic operation optimized or otherwise allocated for OTP memory cells can be selected in response to OTP pin 908=1, and a second bitwise logic operation optimized or otherwise allocated for MTP memory cells can be selected in response to OTP pin 908=0. A set of data A[15:2] 910 can be read as shown and data out: Dout[31:0] 912 is generated. Finally, an ECC output Dout_ECC[23:0] is shown at 914.

The diagrams included herein are described with respect to an integrated circuit device(s) comprising multiple circuits and a resistive-switching array(s). It should be appreciated that such diagrams can include those circuits, and arrays, specified therein, some of the specified circuits/arrays, or additional circuits/arrays not explicitly depicted but known in the art or reasonably conveyed to those of skill in the art by way of the context provided herein. Components of disclosed integrated circuit devices can also be implemented as sub-components of another disclosed component, whereas other components disclosed as sub-components can be separate components in various embodiments. Further, embodiments within a particular Figure of the present specification can be applied in part or in whole to other embodiments depicted in other Figures without limitation, subject only to suitability to achieving a disclosed function or purpose as understood by one of skill in the art, and vice versa.

Figure 10:
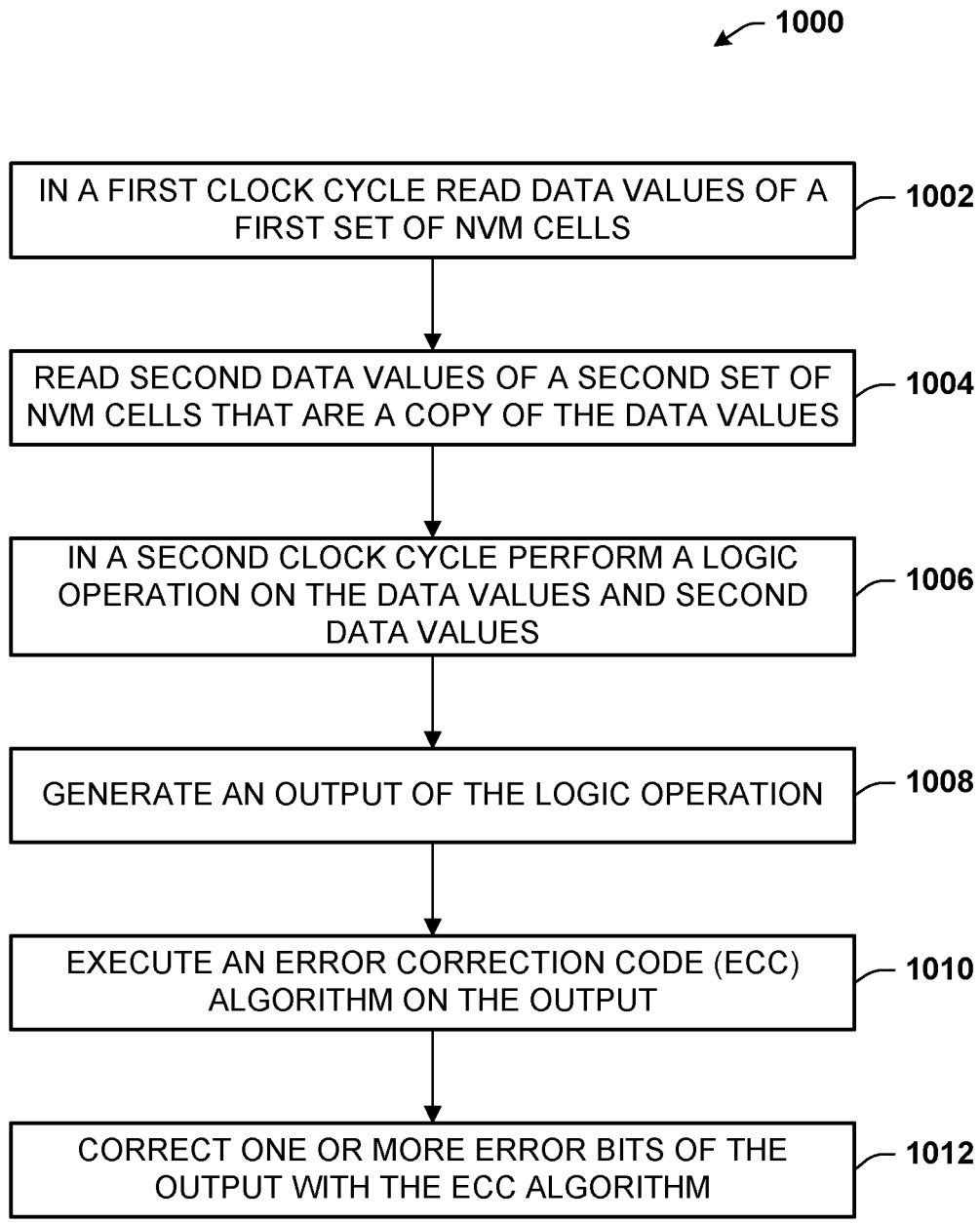
FIG. 10 illustrates a flowchart of a sample method for correcting non-volatile memory bit errors, in further embodiments.
Figure 11:
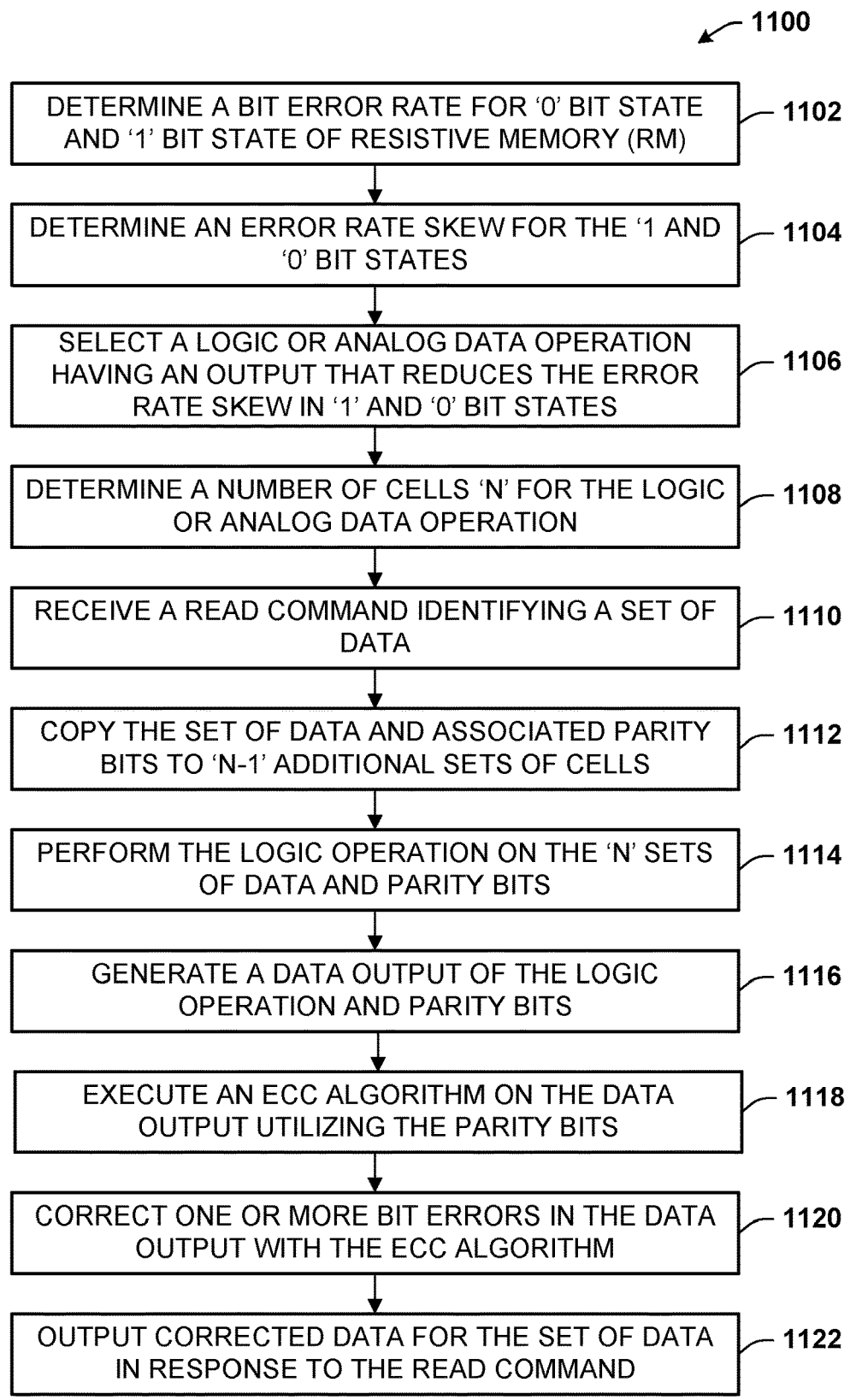
FIG. 11 depicts a flowchart of an example method for correcting non-volatile memory bit errors according to other embodiments.

In view of the exemplary diagrams described supra, process methods that can be implemented in accordance with the disclosed subject matter will be better appreciated with reference to the flow charts of FIGS. 10-11. While for purposes of simplicity of explanation, the methods of FIGS. 10-11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein can be implemented as part of a disclosed method within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methods to an electronic device, stored in embedded memory within the electronic device, and so forth. The term article of manufacture, as used, is intended to encompass a computer program accessible from any computer-readable device, device in conjunction with a carrier, or storage medium, or the like.

FIG. 10 illustrates a flowchart of an example method 1000 for reading a plurality of non-volatile memory cells, according to further embodiments of the present disclosure. In some embodiments, the plurality of non-volatile memory cells can be resistive switching non-volatile memory cells, though other non-volatile memory cells can be utilized in method 1000.

At 1002, method 1000 can comprise reading data values of a first set of non-volatile memory (NVM) cells. Reading the data values can be in a first clock cycle of a read operation, in various embodiments. At 1004, method 1000 can comprise reading second data values of a second set of NVM cells that are a copy of the data values. At 1006, method 1000 can comprise performing a logic operation on the data values and second data values. In an embodiment(s), performing the logic operation can be implemented in a further clock cycle. At 1008, method 1000 can comprise generating an output of the logic operation. At 1010, method 1000 can comprise executing an error correction code (ECC) algorithm on the logic output data set. Moreover, at 1012, method 1000 can comprise correcting one or more error bits of the output with the ECC algorithm.

In an embodiment(s), method 1000 can further comprise, in a second clock cycle prior to the further clock cycle: reading third data values of a third set of non-volatile memory cells, wherein the third data values are a second copy of the data values, and reading fourth data values of a fourth set of non-volatile memory cells, wherein the fourth data values are a third copy of the data values. In further embodiments, the first data values can be represented by matrix A, the second data values can be represented by matrix B, the third data values can be represented by matrix C and the fourth data values can be represented by matrix D. Moreover, the further clock cycle can be a third clock cycle following the second clock cycle, performing the logic operation can further comprise performing the logic operation on matrices A, B, C and D. Additionally, generating the logic output data set further can comprise generating the logic output data set from a logic result of matrices A, B, C and D.

In another embodiment(s), the logic operation is an AND-4 logic operation that determines the logic result as a function of: A∧B∧C∧D. In an alternative embodiment, the logic operation can be an AND-3 logic operation that determines the logic result as a function of: A∧B∧C∧D+A∧B∧C+A∧B∧D+A∧C∧D+B∧C∧D.

According to alternative or additional embodiments of method 1000, the first data values can be represented by A and the second data values can be represented by B, and the logic operation can be an AND-2 logic operation that determines the logic result as a function of: A∧B.

In yet another embodiment, the first data values can be represented by A and the second data values can be represented by B. Further, the logic operation can be an OR-2 logic operation that determines the logic result as a function of: A v B. According to still further embodiments, executing the ECC algorithm can further comprise executing a multi-bit ECC algorithm and correcting multiple bit errors identified for the logic output data set.

In one or more additional embodiments of the present disclosure, method 1000 can further comprise determining a BER0 value and a BER1 value for the plurality of NVM cells in conjunction with the reading of the plurality of NVM cells. Additionally, method 1000 can comprise determining at a second BER0 value and a second BER1 value for the plurality of NVM cells following the reading of the plurality of NVM cells, and selecting a second logic operation different from the logic operation based at least in part on the second BER0 value or the second BER1 value. In an additional clock cycle later in time than the further clock cycle, method 1000 can further comprise reading third data values of the first set of NVM cells, and reading fourth data values of the second set of NVM cells, wherein the fourth data values are a copy of the third data values. In addition to the foregoing, and in another additional clock cycle following the additional clock cycle, method 1000 can comprise performing the second logic operation on the third data values and the fourth data values and generating a second logic output data set. Further, method 1000 can comprise executing the ECC algorithm on the second logic output data set and correcting a bit error identified for the second logic output data set.

In still further embodiments of method 1000, the first set of NVM cells and the second set of NVM cells can be at a first location of an array of the NVM cells, and a third set of NVM cells and a fourth set of NVM cells can be in a second location within the array different from the first location. Additionally, method 1000 can comprise, in a third clock cycle following the further clock cycle: reading third data values of the third set of NVM cells, and reading fourth data values of the fourth set of NVM cells, wherein the fourth data values are a copy of the third data values. Still further, in a fourth clock cycle, method 1000 can comprise performing a second logic operation different from the first logic operation on the third data values and the fourth data values and generating a second logic output data set, and executing the ECC algorithm on the second logic output data set and correcting a bit error identified for the second logic output data set.

In yet another embodiment of method 1000, the first set of NVM cells and the second set of NVM cells are MTP NVM cells, and a third set of NVM cells and a fourth set of NVM cells are OTP NVM cells. In such embodiment, method 1000 can further comprise, in a third clock cycle following the further clock cycle: reading third data values of the third set of NVM cells and reading fourth data values of the fourth set of NVM cells, wherein the fourth data values are a copy of the third data values. Moreover, method 1000 can comprise, in a fourth clock cycle: performing a second logic operation different from the first logic operation on the third data values and the fourth data values and generating a second logic output data set, and executing the ECC algorithm on the second logic output data set and correcting a bit error identified for the second logic output data set.

FIG. 11 illustrates a flowchart of an example method 1100 according to still further embodiments of the present disclosure. At 1102, method 1100 can comprise determining a bit error rate for '0' bit state BER0 and a bit error rate for '1' bit state BER1 of resistive memory. At 1104, method 1100 can comprise determining an error rate skew for BER1 and BER0, and at 1106, method 1100 can comprise selecting a logic or analog data operation having an output that reduces the error rate skew in BER1 and BER0. At 1108, method 1100 can comprise determining a number of cells 'N' for the logic or analog data operation.

At 1110, method 1100 can comprise receiving a read command identifying a set of data, and at 1112 method 1100 can comprise copying the set of data and associated parity bits to 'N−1' additional sets of cells. At 1114, method 1100 can comprise performing the logic operation on the 'N' sets of data and parity bits. In addition, at 1116, method 1100 can comprise generating a data output of the logic operation and parity bits and at 1118, method 1100 can comprise executing an ECC algorithm on the data output utilizing the parity bits. Additionally, at 1120, method 1100 can comprise correcting one or more bit errors in the data output with the ECC algorithm, and at 1122 method 1100 can comprise outputting corrected data for the set of data in response to the read command.

Example Operating Environments

Figure 12:
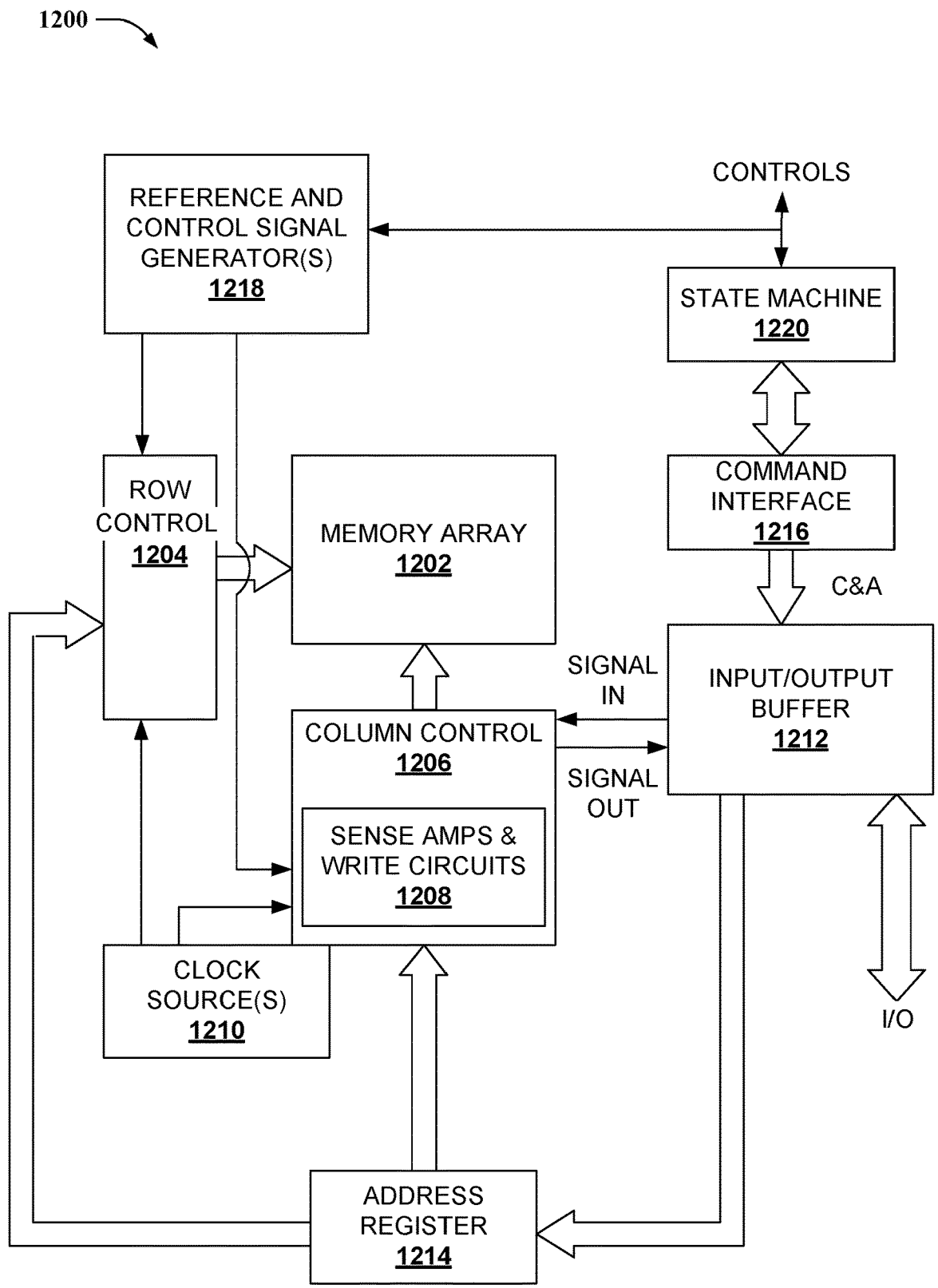
FIG. 12 illustrates a block diagram of an example circuit layout and an array of memory in accordance with one or more disclosed embodiments.

FIG. 12 illustrates a block diagram of an example operating and control environment 1200 for a memory array 1202 of a memory device according to aspects of the subject disclosure. Control environment 1200 and memory array 1202 can be formed within a single semiconductor die in some embodiments, although the subject disclosure is not so limited and in other embodiments some components of control environment 1200 can be formed on a separate semiconductor die communicatively linked to the single semiconductor die. In at least one aspect of the subject disclosure, memory array 1202 can comprise memory selected from a variety of memory cell technologies. In at least one embodiment, memory array 1202 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1206 including, sense amps and write circuits 1208 can be formed adjacent to memory array 1202. Moreover, column controller 1206 can be configured to activate (or identify for activation) a subset of bit lines of memory array 1202. Column controller 1206 can utilize a control signal(s) provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines of memory array 1202. Also utilizing control signals of reference and control signal generator(s) 1218, row controller 1204 can select one or more rows of memory cells with a suitable selection voltage. Moreover, row controller 1204 can facilitate program, erase or read operations by applying suitable voltages at selected word lines.

Sense amps and write circuits 1208 can read data from and write data to (respectively), the activated memory cells of memory array 1202, which are selected by column control 1206 and row control 1204. Data read out from memory array 1202 can be provided to an input/output buffer 1212. Likewise, data to be written to memory array 1202 can be received from the input/output buffer 1212 and written to the activated memory cells of memory array 1202.

A clock source(s) 1210 can provide respective clock pulses to facilitate timing for read, write, and program operations of row controller 1204 and column controller 1206. Clock source(s) 1210 can further facilitate selection of word lines or bit lines in response to external or internal commands received by operating and control environment 1200. Input/output buffer 1212 can comprise a command and address input, as well as a bidirectional data input and output. Instructions are provided over the command and address input, and the data to be written to memory array 1202 as well as data read from memory array 1202 is conveyed on the bidirectional data input and output, facilitating connection to an external host apparatus, such as a computer or other processing device (not depicted, but see e.g., computer 1302 of FIG. 13, infra).

Input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1214. In addition, input data is transmitted to memory array 1202 via signal input lines between column control 1206 and input/output buffer 1212, and output data is received from memory array 1202 via sense amps (1208) and provided on signal output lines to input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus and determine whether data input to the input/output buffer 1212 is write data, a command, or an address. Input commands can be transferred to a state machine 1220.

State machine 1220 can be configured to manage programming and reprogramming of memory array 1202. Instructions provided to state machine 1220 are implemented according to control logic configurations, enabling state machine 1220 to manage read, write, erase, data input, data output, and other functionality associated with memory cell array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1210 or reference and control signal generator(s) 1218. Control of clock source(s) 1210 can cause output pulses configured to facilitate row controller 1204 and column controller 1206 implementing the particular functionality. Output pulses can be transferred to selected bit lines by column controller 1206, for instance, or word lines by row controller 1204, for instance.

Figure 13:
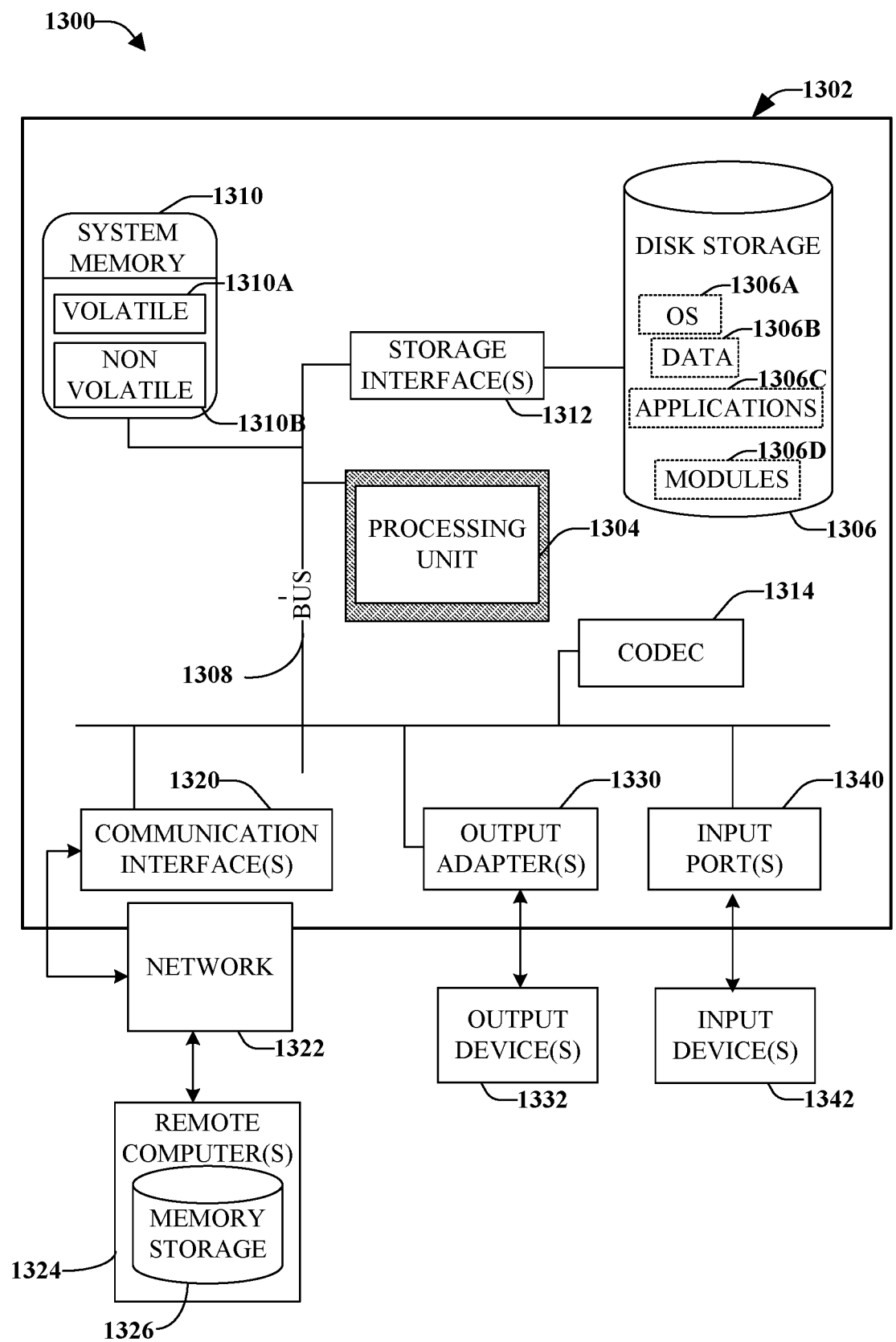
FIG. 13 depicts a block diagram of an example computing environment for implementing one or more additional embodiments of the present disclosure.

In connection with FIG. 13, the systems, devices, or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 13, a suitable environment 1300 for implementing various aspects of the claimed subject matter includes a computer 1302. The computer 1302 includes a processing unit 1304, a system memory 1310, a codec 1314, and a system bus 1308. The system bus 1308 couples system components including, but not limited to, the system memory 1310 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1310 includes volatile memory 1310A and non-volatile memory 1310B. The basic input/output system (BIOS), containing the basic routines to transfer information between elements within the computer 1302, such as during start-up, is stored in non-volatile memory 1310B. In addition, according to present innovations, codec 1314 may include at least one of an encoder or decoder, wherein the at least one of an encoder or decoder may consist of hardware, software, or a combination of hardware and software. Although, codec 1314 is depicted as a separate component, codec 1314 may be contained within non-volatile memory 1310B. By way of illustration, and not limitation, non-volatile memory 1310B can include read only memory (ROM), programmable ROM (PROM), electrically programmable ROM (EPROM), electrically erasable programmable ROM (EEPROM), or flash memory, two-terminal memory, and so on. Volatile memory 1310A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) among others.

Computer 1302 may also include removable/non-removable, volatile/non-volatile computer storage medium. FIG. 13 illustrates, for example, disk storage 1306. Disk storage 1306 includes, but is not limited to, devices like a magnetic disk drive, solid state disk (SSD) floppy disk drive, tape drive, Jaz drive, Zip drive, LS-100 drive, flash memory card, or memory stick, universal serial bus (USB) memory, mini-USB memory, micro-USB memory and other modalities of non-volatile memory hardware. In addition, disk storage 1306 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1306 to the system bus 1308, a removable or non-removable interface is typically used, such as storage interface 1312. It is appreciated that storage devices 1306 can store information related to a user. Such information might be stored at or provided to a server or to an application running on a user device. In one embodiment, the user can be notified (e.g., by way of output device(s) 1332) of the types of information that are stored to disk storage 1306 or transmitted to the server or application. The user can be provided the opportunity to opt-in or opt-out of having such information collected and/or shared with the server or application (e.g., by way of input from input device(s) 1342).

It is to be appreciated that FIG. 13 describes software that acts as an intermediary between users and the basic computer resources described in the suitable operating environment 1300. Such software includes an operating system 1306A. Operating system 1306A, which can be stored on disk storage 1306, acts to control and allocate resources of the computer system 1302. Applications 1306C take advantage of the management of resources by operating system 1306A through program modules 1306D, and program data 1306D, such as the boot/shutdown transaction table and the like, stored either in system memory 1310 or on disk storage 1306. It is to be appreciated that the claimed subject matter can be implemented with various operating systems or combinations of operating systems.

A user enters commands or information into the computer 1302 through input device(s) 1342. Input devices 1342 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via input port(s) 1340. Input port(s) 1340 include, for example, a serial port, a parallel port, a game port, and a universal serial bus (USB). Output device(s) 1332 use some of the same type of ports as input device(s) 1342. Thus, for example, a USB port may be used to provide input to computer 1302 and to output information from computer 1302 to an output device 1332. Output adapter 1330 is provided to illustrate that there are some output devices 1332 like monitors, speakers, and printers, among other output devices 1332, which require special adapters. The output adapters 1330 include, by way of illustration and not limitation, video and sound cards that provide a means of connection between the output device 1332 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1324. The remote computer(s) 1324 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1326 is illustrated with remote computer(s) 1324. Remote computer(s) 1324 is logically connected to computer 1302 through a network 1322 and then connected via communication interface(s) 1320. Network 1322 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1320 refers to the hardware/software employed to connect the network 1322 to the bus 1308. While communication interface(s) 1320 is shown for illustrative clarity inside computer 1302, it can also be external to computer 1302. The hardware/software necessary for connection to the network 1322 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for reading a plurality of non-volatile memory cells, comprising:
   in a first clock cycle:
   reading data values of a first set of non-volatile memory cells;
   reading second data values of a second set of non-volatile memory cells, wherein the second data values are a copy of the data values;
   in a further clock cycle initiated subsequent to initiation of the first clock cycle:
   performing a bitwise logic operation on the data values and the second data values and generating a logic output data set; and
   executing an error correction code (ECC) algorithm on the logic output data set and correcting a bit error identified for the logic output data set.

2. The method of claim 1, further comprising:
   in a second clock cycle initiated prior to the initiation of the further clock cycle and subsequent to the initiation of the first clock cycle:
   reading third data values of a third set of non-volatile memory cells; and
   reading fourth data values of a fourth set of non-volatile memory cells, wherein the fourth data values are a copy of the third data values; wherein:
   the first data values are represented by A, the second data values are represented by B, the third data values are represented by C and the fourth data values are represented by D;
   the further clock cycle is a third clock cycle that is initiated following initiation of the second clock cycle;
   performing the logic operation further comprises performing the logic operation on A, B, C and D; and
   generating the logic output data set further comprises generating the logic output data set from a logic result of A, B, C and D.

3. The method of claim 2, wherein the logic operation is an AND-4 bitwise logic operation that determines the logic result as a function of: A∧B∧C∧D.

4. The method of claim 2, wherein the logic operation is an AND-3 bitwise logic operation that determines the logic result as a function of: A∧B∧C∧D+A∧B∧C+A∧B∧D+A∧C∧D+B∧C∧D.

5. The method of claim 1, wherein:
   the first data values are represented by A and the second data values are represented by B; and
   the logic operation is an AND-2 bitwise logic operation that determines the logic result as a function of: A∧B.

6. The method of claim 1, wherein:
   the first data values are represented by A and the second data values are represented by B; and
   the logic operation is an OR-2 bitwise logic operation that determines the logic result as a function of: A ∨ B.

7. The method of claim 1, further comprising, after completion of the reading the data values and the second data values, performing the bitwise logic operation, executing the ECC algorithm and correcting the bit error:
   selecting a second bitwise logic operation different from the bitwise logic operation;
   in a third clock cycle, later in time than the further clock cycle:
   reading third data values of the first set of non-volatile memory cells;
   reading fourth data values of the second set of non-volatile memory cells, wherein
   the fourth data values are a copy of the third data values;
   in a fourth clock cycle:
   performing the second bitwise logic operation on the third data values and the fourth data values and generating a second logic output data set; and
   executing the ECC algorithm on the second logic output data set and correcting a bit error identified for the second logic output data set.

8. The method of claim 7, further comprising:
   determining a bit error rate (BER) of '0' state cells (BER0 value) and a BER of '1' state cells (BER1 value) for the plurality of non-volatile memory cells in conjunction with the reading of the plurality of non-volatile memory cells; and
   determining a second BER0 value and a second BER1 value for the plurality of non-volatile memory cells following the reading of the plurality of non-volatile memory cells; wherein selecting the second bitwise logic function is based at least in part on the second BER0 value or the second BER1 value.

9. The method of claim 1, further comprising finishing the reading of the plurality of non-volatile memory cells, and following completion of the further clock cycle, reading additional data from the first set of non-volatile memory cells and executing the ECC algorithm and outputting corrected data corresponding to the additional data modified by the ECC algorithm.

10. The method of claim 1, wherein the first set of non-volatile memory cells and the second set of non-volatile memory cells are at a first row or block of an array of the non-volatile memory cells, and a third set of non-volatile memory cells and a fourth set of non-volatile memory cells are at a second row or block within the array different from the first row or block, further comprising:
   in a third clock cycle initiated following the initiation of the further clock cycle:
   reading third data values of the third set of non-volatile memory cells;

reading fourth data values of the fourth set of non-volatile memory cells, wherein the fourth data values are a copy of the third data values;

in a fourth clock cycle initiated subsequent to the initiation of the third clock cycle:

performing a second logic operation different from the first logic operation on the third data values and the fourth data values and generating a second logic output data set, wherein the second logic operation is selected for the second row or block within the array and is different from the bitwise logic operation selected for the first row or block of the array; and executing the ECC algorithm on the second logic output data set and correcting a bit error identified for the second logic output data set.

11. The method of claim 1, wherein the first set of non-volatile memory cells and the second set of non-volatile memory cells are many-time programmable (MTP) non-volatile memory cells, and a third set of non-volatile memory cells and a fourth set of non-volatile memory cells are one-time programmable (OTP) non-volatile memory cells, further comprising:

in a third clock cycle initiated following the initiation of the further clock cycle:

reading third data values of the third set of non-volatile memory cells;

reading fourth data values of the fourth set of non-volatile memory cells, wherein the fourth data values are a copy of the third data values;

in a fourth clock cycle initiated subsequent to the initiation of the third clock cycle:

performing a second logic operation different from the first logic operation on the third data values and the fourth data values and generating a second logic output data set; and executing the ECC algorithm on the second logic output data set and correcting a bit error identified for the second logic output data set.

\* \* \* \* \*